United States Patent
Ararao et al.

(10) Patent No.: US 6,825,067 B2
(45) Date of Patent: Nov. 30, 2004

(54) MOLD CAP ANCHORING METHOD FOR MOLDED FLEX BGA PACKAGES

(75) Inventors: Virgil C. Ararao, Singapore (SG); Hermes T. Apale, Shrewsbury, MA (US); Il Kwon Shim, Singapore (SG)

(73) Assignee: St Assembly Test Services PTE LTD, Singapore (SG)

( * ) Notice: Subject to any disclaimer, the term of this patent is extended or adjusted under 35 U.S.C. 154(b) by 0 days.

(21) Appl. No.: 10/315,533

(22) Filed: Dec. 10, 2002

(65) Prior Publication Data

US 2004/0108601 A1 Jun. 10, 2004

(51) Int. Cl.[7] .......................... H01L 21/44; H01L 21/48; H01L 21/50
(52) U.S. Cl. ...................................................... 438/127
(58) Field of Search .................................. 438/112, 124, 438/126, 127; 264/273–275, 272.17; 425/812

(56) References Cited

U.S. PATENT DOCUMENTS

| | | | | |
|---|---|---|---|---|
| 5,136,366 A | * | 8/1992 | Worp et al. | 257/687 |
| 5,255,157 A | * | 10/1993 | Hegel | 361/783 |
| 5,336,931 A | * | 8/1994 | Juskey et al. | 257/787 |
| 5,612,576 A | * | 3/1997 | Wilson et al. | 257/788 |
| 5,736,789 A | * | 4/1998 | Moscicki | 257/774 |
| 5,773,895 A | * | 6/1998 | Hassan et al. | 257/774 |
| 5,841,192 A | * | 11/1998 | Exposito | 257/701 |
| 5,909,054 A | * | 6/1999 | Kozono | 257/667 |
| 6,214,643 B1 | * | 4/2001 | Chiu | 438/108 |

* cited by examiner

*Primary Examiner*—David A. Zarneke
(74) *Attorney, Agent, or Firm*—William D. Zahrt, II

(57) ABSTRACT

A new method is provided for the creation of a mold cap. The mold cap anchoring feature of the invention is designed and incorporated from the start of the design and fabrication of the substrate. Various design options of the mold anchor of the invention can be implemented. The mold anchor of the invention allows the mold compound to flow underneath the substrate where the mold compound will remain in place until the process of mold formation is completed. The mold compound of the package will penetrate all available cavities surrounding and being accessible from the mold anchor of the invention where the mold compound will remain in place and harden. After hardening, the mold compound surrounding the mold anchor will support the anchored area.

20 Claims, 5 Drawing Sheets

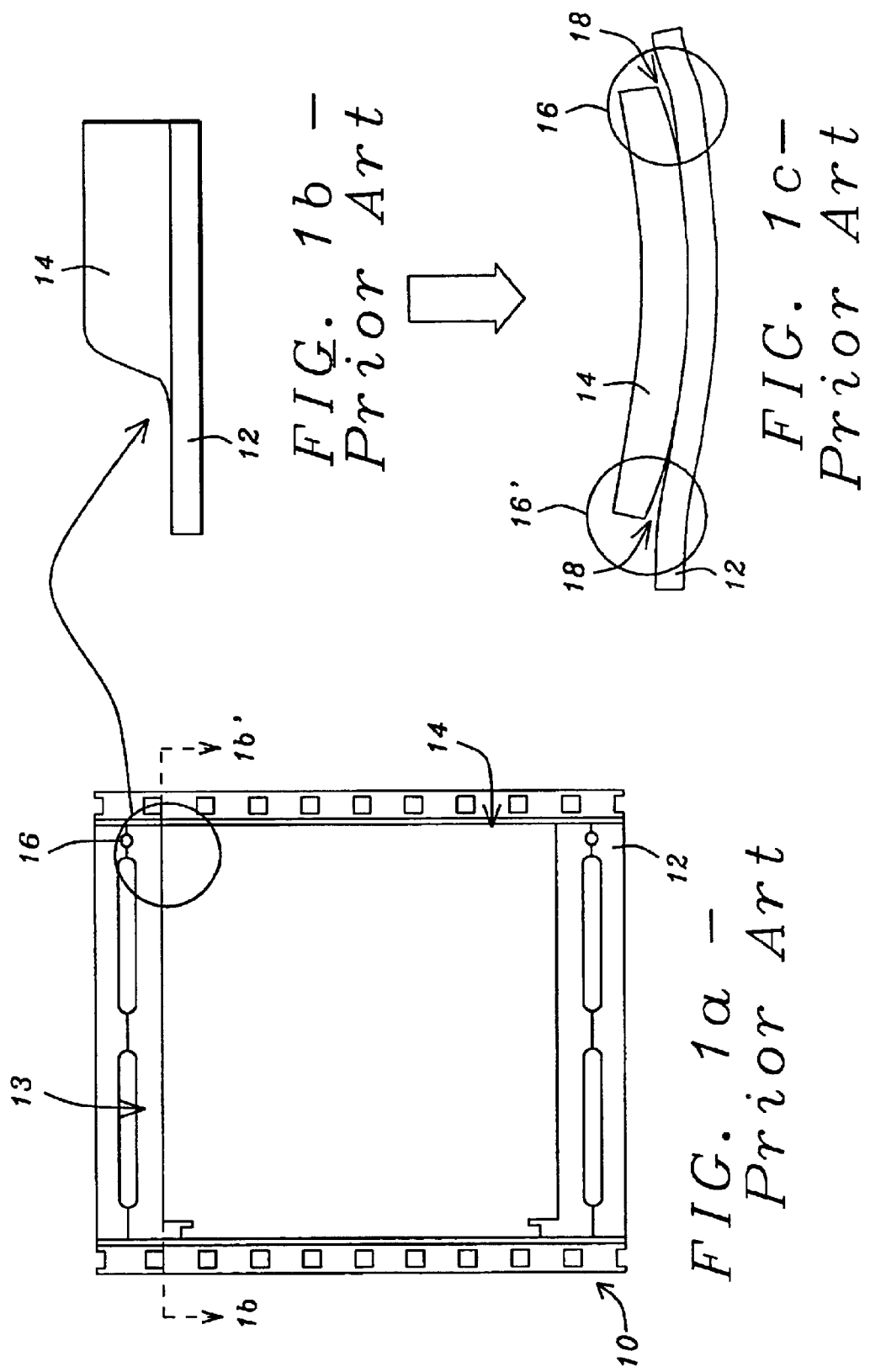

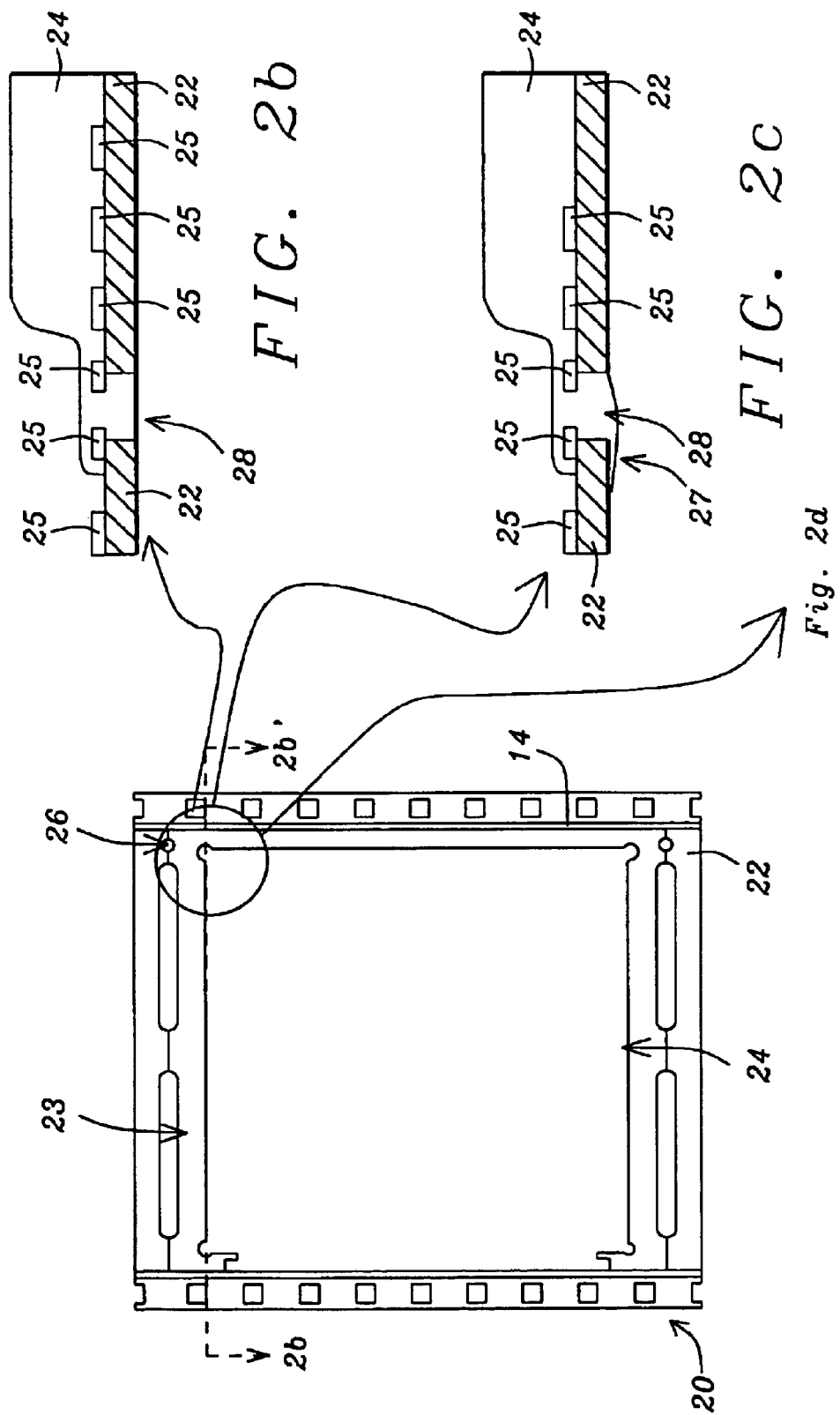

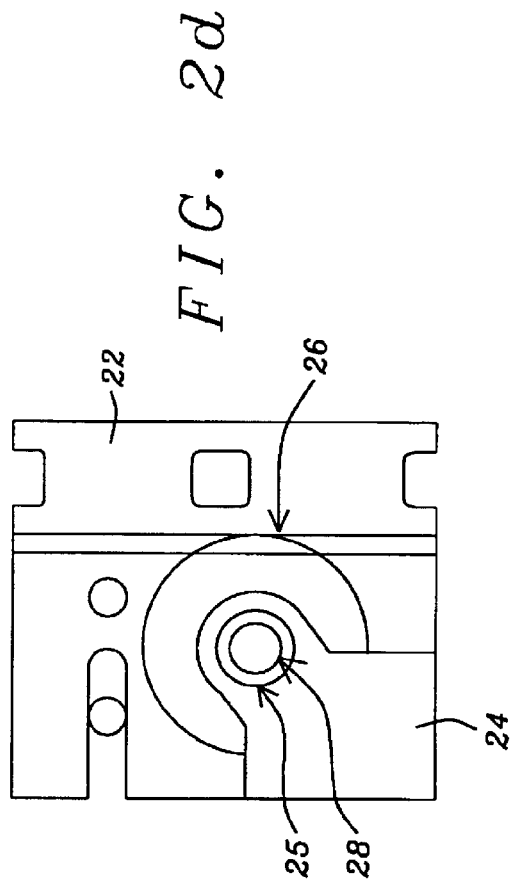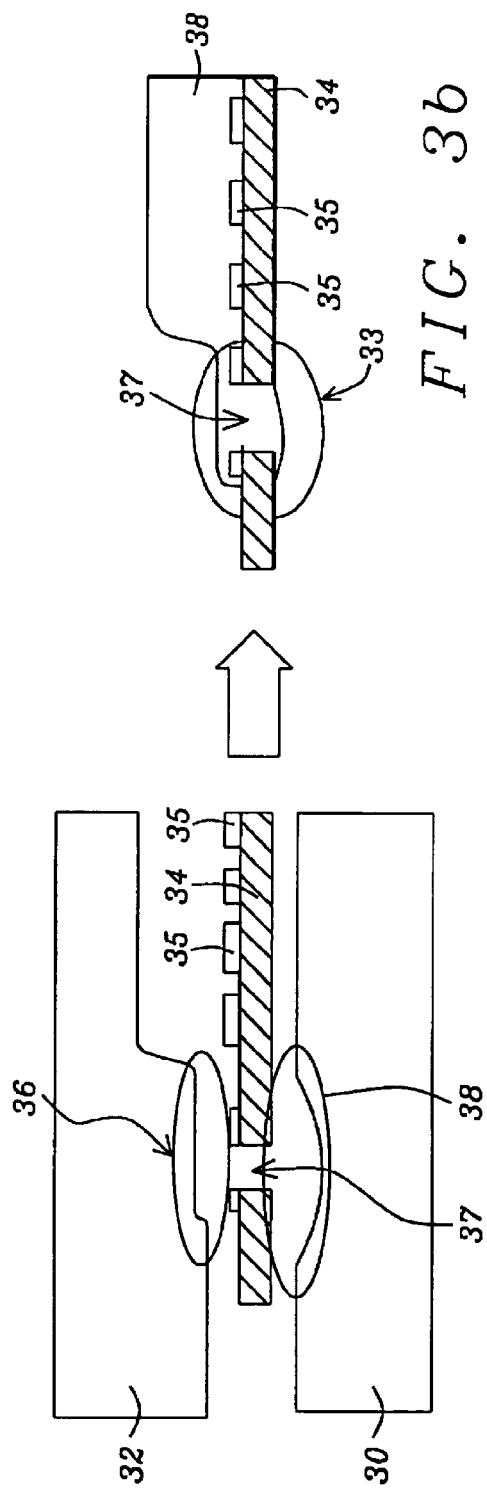

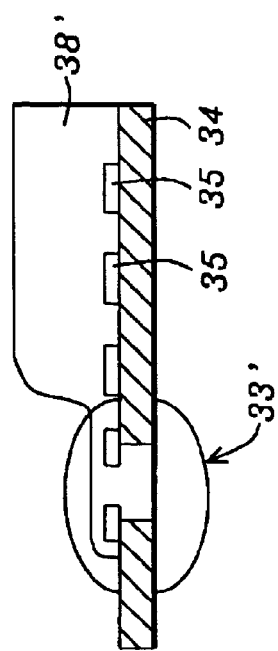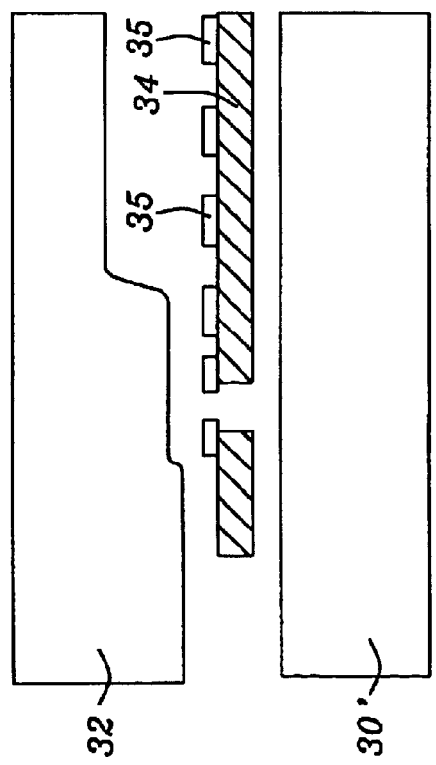

MOLD CAP ANCHORING METHOD FOR MOLDED FLEX BGA PACKAGES

BACKGROUND OF THE INVENTION (1) Field of the Invention

The invention relates to the fabrication of integrated circuit devices, and more particularly, to a molded semiconductor device package and method for the creation thereof.

(2) Description of the Prior Art

For the packaging of semiconductor devices frequent use is made of methods of encapsulation of the devices in packages that are aimed at further usage. These packages have to meet requirements of high speed processing environments and are therefore heavily influenced by such considerations as cost, usability, quality, ease and repeatability of manufacturing, throughput and others.

One of the more commonly used molding materials that is used for the purpose of creating an encapsulated semiconductor device package is resin. Resins occur freely in a natural environment, industrially applied resins are synthetically prepared and can be created with many properties that are of value for a given application. Synthetic resins (such as alkyd resins or phenolic resins) usually have high molecular weight and may have some of the properties of natural resins. Synthetic resins however are typically very different from natural resins. Synthetic resins may be thermoplastic or thermosetting, they can be made by polymerization or by condensation, and they are used mostly as plastics or the essential ingredients of plastic, in varnishes or other coatings, in adhesives and in ion exchange.

In the semiconductor industry, resins are frequently molded into particular forms or shapes that are used to house or package semiconductor chips. These completed molds then serve as chip carriers and may contain parts within the mold that facilitate or enable this function such as a die pad (to position the chip onto), metal extensions (lead fingers) that serve to interconnect the packaged chip with its surrounding electrical environment and means (such as wire bonding) for connecting the chip to metal extensions.

It is thereby also common practice to adapt plastic or resin chip carriers to a high speed semiconductor manufacturing environment, for the main reason that this is the predominant environment that is being used to produce high volumes of semiconductor chips at a competitive price. The chip carriers must thereby also be adaptable to a variety of chip sizes, again to make the chip carrier acceptable from a cost point of view. To adapt the chip carrier to a high-speed manufacturing environment, the design must be such that no parts of the carrier can interfere with the manufacturing process due to protruding parts of the carrier. This could cause deformation of the protruding parts in addition to slowing down the manufacturing process due to the required intervention to remove the offending carrier.

A mold cavity frequently consists of two sections, an upper section and a lower section. The lower section forms, after molding, the support for mounting the chip and for supporting lead fingers. These supporting components are inserted in the lower mold prior to the formation of the pre-molded plastic chip carrier.

In addition to the above considerations relating to the creation of a mold, considerations of adhesion between the epoxy mold compound and the substrate of the package play an important role in the creation of a mold-packaged semiconductor device. This concern applies to the four corners and the edges of the mold cap where stress concentrations are most likely to occur, a stress that is highly temperature dependent. Present practices to alleviate the impact of corner stress focus on substrate cleanliness, achieved by for instance surface plasma treatment, and by matching the stress related properties of physically interfacing elements of the package. Stress related adverse impact on the overall package is typically and most likely concentrated at the most exposed or weakest points of the mold cap. The invention addresses these concerns of mold cap creation and reliability.

SUMMARY OF THE INVENTION

A principle objective of the invention is to provide a mold cap that is free of problems of adhesion to surrounding surfaces.

Another objective of the invention is to provide an anchor for the mold cap such that the mold cap is more firmly secured and kept in place.

In accordance with the objectives of the invention a new method is provided for the creation of a mold cap. The mold cap-anchoring feature of the invention is designed and incorporated from the start of the design and fabrication of the substrate. Various design options of the mold anchor of the invention can be implemented. The mold anchor of the invention allows the mold compound to flow underneath the substrate where the mold compound will remain in place until the process of mold formation is completed. The mold compound of the package will penetrate all available cavities surrounding and being accessible from the mold anchor of the invention where the mold compound will remain in place and harden. After hardening, the mold compound surrounding the mold anchor will support the anchored area.

BRIEF DESCRIPTION OF THE DRAWINGS

FIGS. 1a through 1c show conventional methods of creating a mold cap over the surface of a supporting substrate.

FIGS. 2a through 2c show methods of the invention of creating a mold cap over the surface of a supporting substrate.

FIGS. 3a and 3b show details of the mold cap to substrate interface and the anchoring that is achieved between these two elements.

FIGS. 3c and 3d show an additional implementation that closely resembles the implementation shown in FIGS. 3a and 3b.

DESCRIPTION OF THE PREFERRED EMBODIMENTS

Figure 4A:
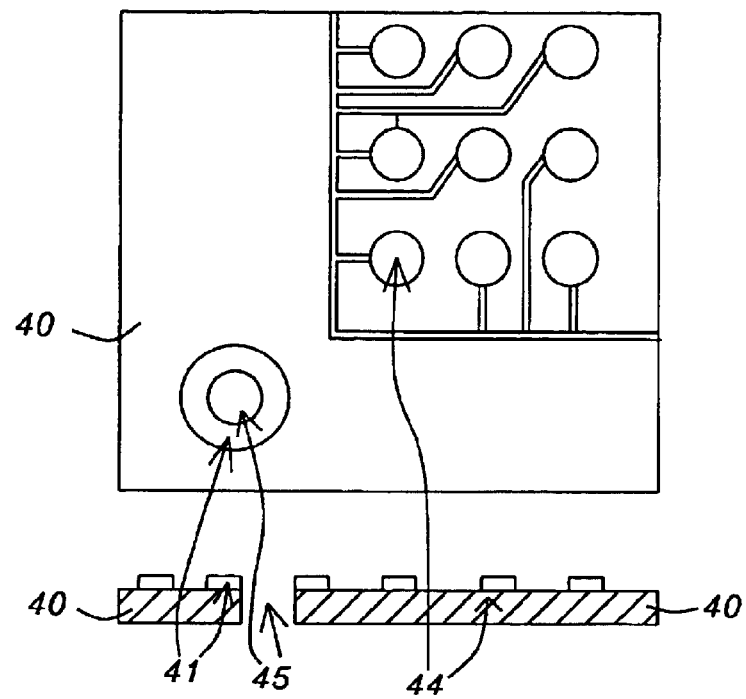
FIGS. 4a and 4b shows implementation details of the substrate that are provided for purposes of anchoring the mold cap to the substrate.

The invention provides a method for anchoring the mold cap of a mold compound to the underlying and supporting substrate of the package. The mold anchor of the invention is preferably applied in the creation of relatively thin semiconductor device packages. The mold anchor of the invention secures the mold cap to the substrate. The mold cap of the invention may be provided at the edges or corners of the mold cap. The active area of the mold cap may in this manner by increased.

The conventional method of providing a mold cap over the surface of a supporting substrate in a semiconductor device package will first be highlighted, using FIGS. 1a through 1c for this purpose. Shown in FIG. 1a is a top view 10 of a substrate 12 over the surface of which a mold cap 14 has been deposited using conventional methods of mold cap formation. A film 13 of polyimide has for protective purposes been applied over the surface of substrate 12 prior to the creation of the mold cap 14.

Further detail of one of the corners 16 of the substrate 12 with the thereover provided mold cap 14 has been shown in the cross section of FIG. 1b, the cross section being taken along the line 1b-1b' of FIG. 1a and bounded by the highlighted circle 16 shown in FIG. 1a. The cross section shown in FIG. 1b represents a typical substrate 12 design with a mold cap 14 applied over the surface of substrate 12. Not shown in FIG. 1b is the effect of temperature that is experienced by the substrate/mold cap combination as a result of mold reflow. This effect is shown in the cross section of FIG. 1c, which shows in this instance a cross section along the line 1b-1b' of FIG. 1a without however being bounded by the circle 16 of FIG. 1a but being extended between the extremities of the cross section as highlighted with circles 16 and 16' in the cross section of FIG. 1c. One of the reasons for mold reflow is to assure that the mold 14 properly adheres to the surface of the substrate 12. This adhesion however tends to warp the substrate 12 due to a combination of contraction of the mold compound 14 and the relative good adhesion that exists between the mold compound 14 and the substrate 12. This warpage of the substrate 12 is shown in the cross section of FIG. 1c. It is clear from the cross section of FIG. 1c that extreme tension of separation will be created between the mold cap 14 at the extremities of the mold cap, that separation results in the delamination 18 shown in the cross section of FIG. 1c, where the mold cap 14 separates from the underlying substrate 12. This delamination is highly undesirable since it exposes the underlying substrate 12 over the surface areas of the delamination 18, thereby introducing the possibility of creating deposits over these exposed surface areas which have a negative impact on package performance and reliability.

To prevent the delamination 18 that is shown in the cross section of FIG. 1c, the invention provides anchor points in the four corners of the substrate as has been highlighted in and will be described using FIGS. 2a through 2d. Anchoring can also be provided at any other surface area around the perimeter of the substrate that is sued to create the device package.

FIG. 2a shows a top view 20 of the supporting substrate 22 over the surface of which has been applied a mold cap 24. A polyimide tape 23 has been applied over the surface of substrate 22 prior to the formation of the mold cap 24, copper interconnect traces 25 created over the surface of substrate 22 have been highlighted in FIGS. 2c and 2d.

Of special interest to the invention are the surface areas in the four corners of the substrate 22, of which one illustrative example has been highlighted by surface area 26 in FIG. 2a. A cross section, taken along the line 2b-2b' of FIG. 2a, of this surface area 26 is shown in FIGS. 2b and 2c.

Specifically notable in the cross section of FIG. 2b is the opening 28 that has been created through the substrate 22, an opening that is provided for each of the corners of substrate 22 of which the cross section shown in FIG. 2b is a representative example. It is clear that the mold compound 24 will, at the time of filling of the mold cavity with mold 24, penetrate opening 28 and in so doing will, after hardening of the mold, firmly anchor the mold compound 24 in each of the corners of substrate 22.

To further emphasize this anchoring effect, it is beneficial to enable the mold to penetrate underneath the substrate. An example of this is shown in the cross section of FIG. 2c in which an additional relief or opening 27 is provided for this purpose in the lower part of the mold cavity (the cavity bar). This opening 27 is filled with mold compound at the time that the mold compound enters into the mold cavity. This additional relief 27 has been shown in the cross section of FIG. 2c as being of rounded cross section, resembling a segment of a circle.

There is no reason for this additional relief to be limited to such a cross section, any shape or form that further enhances the anchoring of the mold compound to the underlying substrate can be applied for this purpose of anchoring. For instance, a finned cross section, resembling for instance cooling fins of a heatsink, wherein parts of the additional relief fan-out as separate sub-elements from a central part can be envisioned as providing extreme anchoring capabilities.

FIG. 2d shows a top view of anchor 26 of FIG. 2a, more clearly highlighting the location of the anchor 26 of mold compound with respect to both the substrate 22 and the applied mold cap 24. The anchor 26 extends out (as shown in FIG. 2b) parallel to the plane of the substrate 22 from the body of the mold compound over the semiconductor device (the mold cap 24) to the opening 28. This assures that the mold compound of the anchor 26 penetrates perpendicular to the plane of the substrate 22 into the opening 28 created through the substrate 22.

With the basic concept of the invention in mind, that is providing an anchor that forms a solid interconnection between the supporting substrate and the overlying mold cap, it is clear that a number of variations of this concept can be used. Some of these variations are highlighted using FIGS. 3a through 3d for this purpose.

Referring first specifically to the cross section that is shown in FIG. 3a, there is shown a cross section 32 of a top cavity bar, a cross section 30 of a bottom cavity bar, a substrate 34 with copper interconnect traces 35 provided over the surface thereof. Anchor opening 37 has been provided through (each of the four) corners of substrate 34, by modifying the contours of the top and bottom cavity bars 32/30 where these cavity bars are aligned with the anchor opening 37, the contours of the applied mold compound can be controlled.

In the example that is shown in the cross section of FIG. 3a, a top cavity relief 36 has been indicated that extends over a distance of substrate 34, allowing additional mold compound to collect over the surface of the substrate 34 and surrounding the anchor opening 37. A bottom cavity relief 38 has the same effects as this effect is now introduced for mold collection underneath the substrate 34. The combined effect of these relief 36 and relief 38 is shown in the completed mold compound 38 as shown in the cross section of FIG. 3b, where the anchor area 33 is now provided with mold compound 38 that extends above the upper and below the lower surface of substrate 34. Copper traces 35 are also highlighted in the cross sections of FIGS. 3a and 3b.

An additional implementation that closely resembles the implementation shown in FIGS. 3a and 3b is highlighted in FIGS. 3c and 3d. In the latter implementation the relief 38, FIG. 3a, in the bottom cavity bar 30' is omitted, resulting in a completed mold compound 38' shown in cross section in FIG. 3d. The anchor area 33' is now provided with mold compound 38' that extends above the upper surface of substrate 34.

Figure 4B:
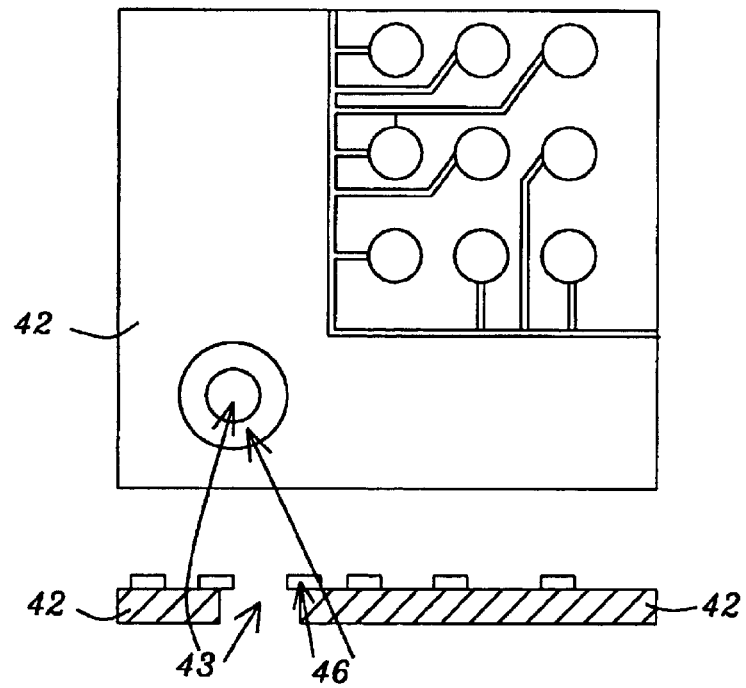

Additional details relating to the design of the substrate of the invention are shown in FIGS. 4a and 4b, both FIGS. 4a and 4b showing a top view of one (of the four) corner of substrates 40 and 42. The difference between substrates 40 and 42 is created by the difference in the creation of the anchor holes 45 (FIG. 4a) and 43 (FIG. 4b).

The anchor hole 45, FIG. 4a, has been created using a drilling or punch-through process, which as shown in the cross section of FIG. 4b as not differentiating between the presence or absence or copper 41.

The anchor hole 43, FIG. 4b, has been created applying an etch process, which creates the anchor through hole 43 while not affecting copper 46, creating overhang copper 46.

Elements 44, FIG. 4a, are copper pads created over the surface of substrate 40, 48 is polyimide tape applied over the surface of substrate 40.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modification which fall within the scope of the appended claims and equivalents thereof.

What is claimed is:

1. A method for mold cap anchoring in creating semiconductor device packages, comprising steps of:

providing a semiconductor device supporting substrate, said substrate having been provided with interconnect metal;

creating at least one opening through said substrate, said at least one opening not intersecting with said interconnect metal;

mounting at least one semiconductor device over the surface of said substrate, thereby electrically connecting said at least one semiconductor device to said interconnect metal; and applying a mold compound over the surface of said substrate and over said semiconductor device, the applying said mold compound including at least one anchor of said mold compound extending out parallel to the plane of said substrate from the body of said mold compound over said semiconductor device and assuring that said mold compound of the anchor penetrates perpendicular to the plane of said substrate said at least one opening created through said substrate.

2. The method of claim 1, said at least one opening comprising four openings located in four corners of said substrate.

3. The method of claim 1, said creating at least one opening through said substrate comprising methods of drilling an opening.

4. The method of claim 1, said creating at least one opening through said substrate comprising methods of punching an opening.

5. The method of claim 1, said crating at least one opening through said substrate comprising methods of etching an opening.

6. The method of claim 1, said applying a mold compound over the surface of said substrate comprising steps of:

positioning said substrate with said at least one semiconductor device being mounted over the surface thereof in a mold cavity; and entering mold compound into said mold cavity.

7. The method of claim 6, said mold cavity comprising:

a top cavity bar, and a bottom cavity bar.

8. The method of claim 7, said bottom cavity bar having been provided with at least one first relief, said at least one first relief being aligned with said at least one opening created through said substrate.

9. The method of claim 7, said top cavity bar having been provided with at least one second relief, said at least one second relief being aligned with said at least one opening created through said substrate.

10. The method of claim 1, said at least one opening created through said substrate being used as an air vent during said applying a mold compound over the surface of said substrate.

11. The method of claim 1, said at least one opening comprising at least one opening located along a perimeter of said substrate.

12. A method for mold cap anchoring in creating semiconductor device packages, comprising steps of:

providing a semiconductor device supporting substrate, said substrate having been provided with interconnect metal;

creating openings through said substrate in corners of said substrate, said openings not intersecting with said interconnect metal;

mounting at least one semiconductor device over the surface of said substrate, electrically connecting said at least one semiconductor device to said interconnect metal; and applying a mold compound over the surface of said substrate and over said semiconductor device, the applying said mold compound including anchors of said mold compound extending out parallel to the plane of said substrate from the body of said mold compound over corners of said semiconductor device and assuring that said mold compound of the anchor penetrates perpendicular to the plane of said substrate said openings through said substrate created in corners of said substrate.

13. The method of claim 12, said creating openings through said substrate in corners of said substrate comprising methods of drilling openings.

14. The method of claim 12, said creating openings through said substrate in corners of said substrate comprising methods of punching openings.

15. The method of claim 12, said creating openings through said substrate in corners of said substrate comprising methods of etching openings.

16. The method of claim 12, said applying a mold compound over the surface of said substrate comprising steps of:

positioning said substrate with said at least one semiconductor device being mounted over the surface thereof in a mold cavity; and entering mold compound into said mold cavity.

17. The method of claim 16, said mold cavity being enclosed by:

a top cavity bar; and a bottom cavity bar.

18. The method of claim 17, said bottom cavity bar having been provided with at least one first relief, said at least one first relief being aligned with at least one of said openings created through said substrate in corners of said substrate.

19. The method of claim 17, said top cavity bar having been provided with at least one second relief, said at least one second relief being aligned with at least one of said openings created through said substrate in corners of said substrate.

20. The method of claim 12, said openings created through said substrate in corners of said substrate being used as an air vents during said applying a mold compound over the surface of said substrate.

* * * * *